United States Patent [19]

Dowler et al.

[11] Patent Number: 4,971,941

[45] Date of Patent: Nov. 20, 1990

[54] IMAGING SHEET FOR ACHIEVING COLOR BALANCE

[75] Inventors: James A. Dowler, Franklin, Ohio; Peter G. Engeldrum, Bloomfield, Conn.; Roger Jerry, Charlotte, N.C.

[73] Assignee: The Mead Corporation, Dayton, Ohio

[21] Appl. No.: 199,084

[22] Filed: May 26, 1988

[51] Int. Cl.$^5$ .......................... B41M 5/16; B41M 5/22
[52] U.S. Cl. ...................................... 503/204; 427/150; 427/152; 428/195; 428/204; 428/207; 428/209; 428/913; 428/914; 430/138; 503/200; 503/207; 503/215
[58] Field of Search ................................. 427/150–152; 428/913, 914, 195, 204, 207, 209; 430/138; 503/204, 215, 226, 200, 207

[56] References Cited

U.S. PATENT DOCUMENTS 4,576,891 3/1986 Adair et al. .......................... 430/138

OTHER PUBLICATIONS

*Hach's Chemical Dictionary*, 4th Ed., 1969, p. 227.

*Primary Examiner*—Bruce H. Hess
*Attorney, Agent, or Firm*—Smith & Schnacke

[57] ABSTRACT

An imaging sheet used for achieving color balance in a full-color imaging system is disclosed. The sheet is characterized by utilizing three sets of microcapsules, each containing a different colorless image-agent and a photohardenable or photosoftenable composition, and a corrective dye associated with the substrate. Association of the corrective dye with the substrate achieves color balance by equalizing the speed of the different colorless color-forming microcapsules.

22 Claims, No Drawings

IMAGING SHEET FOR ACHIEVING COLOR BALANCE

BACKGROUND OF THE INVENTION

1. Field of the Invention

The present invention relates to an imaging sheet for achieving color balance in a full color imaging system. More particularly, the present method corrects color balance for a full color imaging system including three sets of pressure rupturable photosensitive microcapsules by incorporating a corrective dye into the system.

2. Description of the Prior Art

When producing full color images, it is commonly known in the art to utilize three sets of photosensitive microcapsules, each containing a different color-forming agent and a photocurable composition which is sensitive to a particular wavelength of light. In a typical system, the microcapsules contain cyan, magenta, and yellow color-forming agents and photocurable compositions which are respectively sensitive to wavelengths in the red, green, and blue regions of light. Such a system is described and disclosed U.K. Patent No. 2,113,860, the contents of which are herein incorporated by reference.

In a known full color system, each microcapsule contains a photohardenable composition including a radiation curable composition which undergoes an increase in viscosity upon exposure to actinic radiation and a photoinitiator. Each photoinitiator is particularly sensitive to a given band of actinic radiation.

Depending on the radiation source used, the photoinitiators selected determine, in a large part, the film speed of the respective microcapsules. If the photoinitiators react with light with different efficiencies, the microcapsules will have different film speeds. As a consequence, for a predetermined amount of radiation, the microcapsules will release different amounts of color-forming agents and the colors produced by the three sets of microcapsules will not be balanced. In addition, color imbalance can occur as a result of the different spectral energy characteristics exhibited by the light source utilized.

Attempts have been made to correct color imbalance caused by either the photoinitiators contained in the microcapsules or the radiation source. A first method involves using a trial and error technique to adjust the relative proportion of the amounts of microcapsules to be coated onto a substrate. In theory, the substrate could contain one-third cyan color-forming microcapsules, one-third magenta color-forming microcapsules and one-third yellow color-forming microcapsules. However, if the film speed of a particular color-forming microcapsule is faster than the film speed of the other two color-forming microcapsules, higher amounts of the faster speed microcapsules or lower amounts of the slower speed microcapsules could be coated onto a substrate to create color balance.

In another method, the light emitted by the radiation source may be altered to provide color balance. This typically involves the use of color or ultraviolet filters which alter the spectral energy characteristics of the radiation source.

Although both of the above described methods have been utilized to control color balance, it would be desirable to develop an imaging sheet for achieving color balance in a full color imaging system without altering either the amounts of microcapsules coated onto a substrate or the radiation source utilized.

Brief Summary of the Invention

In accordance with the present invention, an imaging sheet which provides improved color balance is disclosed. The imaging sheet includes: a substrate having front and back surfaces; first, second, and third sets of photosensitive microcapsules, each set of microcapsules containing an image-forming agent for a different color, and a photohardenable or photosoftenable composition; said microcapsules being provided in a coating on the front surface of said substrate; and one or more color corrective dyes associated with the sheet to provide color balance.

The inventors have discovered that by associating one or more color corrective dyes with the imaging sheet, improved color balance is achieved. For example, if in a cyan/magenta/yellow full color system the speed of the cyan microcapsules is too fast, according to the present invention, a color corrective dye is associated with the substrate to act as a filter and thereby slow down the film speed of the cyan microcapsules.

The color corrective dye(s) may be incorporated in the imaging sheet in a number of different configurations. A first embodiment comprises coating the substrate with the color corrective dye(s) and thereafter coating the microcapsules onto the dye(s). A second embodiment comprises coating the microcapsules onto the substrate and then coating the color corrective dye(s) onto the microcapsules. A third embodiment comprises mixing the color corrective dye(s) and microcapsules together and coating the resultant mixture onto the substrate.

A fourth embodiment comprises coating the microcapsules and the color corrective dye(s) on opposite surfaces of the substrate. A fifth embodiment comprises incorporating the color corrective dye(s) into the substrate itself. Other embodiments comprise associating the color corrective dye(s) with a metallized layer which is coated onto the front or back surface of the substrate.

Accordingly, it is an object of the present invention to provide an imaging sheet for achieving color balance in a full color imaging system.

It is a further object of the present invention to achieve color balance by associating a corrective dye with an imaging sheet.

It is yet another object of the present invention to incorporate the color corrective dye with the microcapsule formulations prior to coating.

It is yet an additional object of the present invention to produce an imaging sheet having contained therein a correction dye.

These, as well as other objects, will be readily recognized and understood by one skilled in the art as reference is made to the following detailed description of the preferred embodiments.

Detailed Description Of The Preferred Embodiments

In describing the preferred embodiments, certain terminology will be used for the sake of clarity. This terminology encompasses all technical equivalents which perform substantially the same function in the substantially the same way to produce the same result.

The present invention corrects color imbalance in an imaging sheet of a full-color imaging system. For example, full-color panchromatic imaging systems are described in U.S. Pat. No. 4,576,891, European Published Application No. 0 223 587 and U.K. Patent No. 2,113,860. These systems are preferably single exposure systems which employ imaging sheets having three sets of microcapsules which respectively contain cyan, magenta, and yellow color precursors. Each set of microcapsules preferably contains a radiation curable monomer or prepolymer and a photoinitiator. As is explained in more detail in the references, each set of microcapsules is primarily sensitive in a different wavelength band such that the microcapsules can be individually exposed with minimum cross-talk. In panchromatic systems, the cyan, magenta and yellow color-forming photosensitive microcapsules are respectively sensitive to red, green and blue light.

Positive working photohardenable or negative working photosoftenable radiation sensitive compositions can be present in the internal phase of the microcapsules. Photohardenable compositions such as photopolymerizable and photocrosslinkable materials increase in viscosity or solidify upon exposure to radiation and yield positive images.

Ethylenically unsaturated organic compounds are useful radiation curable materials. These compounds contain at least one terminal ethylene group per molecule. Typically, they are liquid. Polyethylenically unsaturated compounds having two or more terminal ethylene groups per molecule are preferred. An example of this preferred subgroup is ethylenically unsaturated acid esters of polyhydric alcohols, such as trimethylol propane triacrylate (TMPTA) and dipentaerythritol hydroxypentaacrylate (DPHPA).

Each of the three sets of microcapsules contains a photoinitiator. The photoinitiators are primarily sensitive in different wavelength bands to enable selective exposure of each set of microcapsules.

A preferred photoinitiator system for use in the present invention includes ionic dye-counter ion compounds described in European Application Publication No. 0 233 587. A preferred class of ionic dye-counter ions is cationic dye borates and still more particularly cyanine dye borates. Typically the borate is a triphenylalkyl borate such as a triphenylbutyl borate. Other dye complexes such as Rose Bengal iodonium and Rose Bengal pyryllium complexes may also be used.

Examples of other photoinitiators useful in the present invention include diaryl ketone derivatives, quinones and benzoin alkyl ethers. Where ultraviolet sensitivity is desired, suitable photoinitiators include alkoxy phenyl ketones, O-acylated oximinoketones, polycyclic quinones, phenanthrenequinone, naphthoquinone, diisopropylphenanthrenequinone, benzophenones and substituted benzophenones, xanthones, thioxanthones, halogenated compounds such as chlorosulfonyl and chloromethyl polynuclear aromatic compounds, chlorosulfonyl and chloromethyl heterocyclic compounds, chlorosulfonyl and chloromethyl benzophenones and fluorenones and haloalkanes. In many cases it is advantageous to use a combination with imaging photoinitiators.

Initiators including the ionic dye complexes may preferably include an autoxidizer. Suitable examples include N,N'-dialkylanilines as described in the European Publication.

Various image-forming agents can be used in association with the radiation curable compositions to produce the three sets of microcapsules. For example, images can be formed by the interaction of color formers and color developers of the type conventionally used in the carbonless paper art. In addition, images can be formed by the color producing interaction of chelating agents and metal salts or by the reaction of certain oxidation-reduction reaction pairs, many of which have been investigated for use in pressure-sensitive carbonless papers. Alternatively, oil soluble dyes can be used and images can be formed by transfer to plain or treated paper. The internal phase itself has its own image-forming capability. For example, it is known that many of the toners used in xerographic recording processes selectively adhere to the image areas of an imaging sheet exposed and developed as in the present invention.

Furthermore, for each set of microcapsules, the image-forming agent can be provided inside the microcapsules, in the microcapsule wall, or outside the microcapsules in the same layer as the microcapsules or in a different layer. In the latter cases, the internal phase picks up the image-forming agent (e.g., by dissolution) upon being released from the microcapsules and carries it to the developer layer or an associated developer sheet.

Typical color precursors useful in the aforesaid embodiments for producing three sets of microcapsules include colorless electron donating type compounds. Representative examples of such color formers include substantially colorless compounds having in their partial skeleton a lactone, a lactam, a sulfone, a spiropyran, an ester or an amido structure such as triarylmethane compounds, bisphenylmethane compounds, xanthene compounds, fluorans, thiazine compounds, spiropyran compounds and the like. Cyan, magenta, and yellow color precursors useful in the present invention are commercially available.

The discrete walled microcapsules used in the present invention can be produced using known encapsulation techniques including coacervation, interfacial polymerization, polymerization of one or more monomers in an oil, etc. Representative examples of suitable wall-formers are gelatin materials (see U.S. Pat. Nos. 2,730,456 and 2,800,457 to Green et al.) including gum arabic, polyvinyl alcohol, carboxy-methyl-cellulose; resorcinol-formaldehyde wall formers (see U.S. Pat. No. 3,755,190 to Hart et al.); isocyanate wall-formers (see U.S. Pat. No. 3,914,511 to Vassiliades); isocyanate-polyol wall-formers (see U.S. Pat. No. 3,796,669 to Kiritani et al.); urea-formaldehyde wall-formers, particularly urea-resorcinol-formaldehyde in which oleophilicity is enhanced by the addition of resorcinol (see U.S. Pat. Nos. 4,001,140; 4,087,376 and 4,089,802 to Foris et al.); and melamine-formaldehyde resin and hydroxypropyl cellulose (see commonly assigned U.S. Pat. No. 4,025,455 to Shackle). A melamine-formaldehyde capsule is particularly preferred.

The mean microcapsule size used in the present invention generally ranges from about 1 to 25 microns.

To form the inventive imaging sheet, appropriate amounts of each set of microcapsules is coated onto a substrate. Generally, the microcapsules are coated in an amount of about 4 to 10 $g/cm^2$, and preferably in an amount of about 6 $g/cm^2$. A common substrate for supporting the microcapsules is a transparent film or paper. The paper may be a commercial impact raw stock, or special grade paper such as cast-coated paper or chrome-rolled paper. Transparent substrates such as polyethylene terephthalate and translucent substrates can also be used in this invention and are often preferred. Another preferred substrate for the microcapsules is aluminized Mylar (PET). The microcapsules can be located on either the top or bottom surface of a transparent substrate to form an imaging sheet.

The inventive imaging sheet has associated with it one or more corrective dyes. The dyes selected are screening and/or photosensitive dyes having a λ max in the visible spectrum, typically between 400 and 700 nanometers. Dyes suitable for use in the present invention include: anhydro-3,3-dicarboxyethyl-5,5,9-trimethyl-2,2-thiacarbocyanine betaine, anhydro-3,3-dicarboxymethyl-2,2-thiacarbocyanine betaine, 3,3-diallyl-2,2-thiacarbocyanine bromide, 3,3-diallyl-2,2-thiacarbocyanine iodide, 6,7,6,7-dibenzo-3,3-diethyl-9-methyl-2,2-thiacarbocyanine iodide, 3,3-di-n-butyl-9-methyl-2,2-thiacarbocyanine iodide, 2-(p-diethylaminostyryl)-1-ethylpyridine iodide, 3,3-diethyl-9-methyl-2,2-selenacarbocyanine iodide, 3,3-diethyl-9,11-neopentylene-2,2-thiadicarbocyanine iodide, 1,1-diethyl-2,4-quinocarbocyanine iodide, 3,3-diethyl-2,2-thiazolinocarbocyanine iodide, 2-(p-dimethylaminostyryl)-1-methylpyridine iodide, 3,3,9-triethyl-2,2-thiacarbocyanine, 2-[3-ethyl-4-oxo-5-(1-ethyl-4-quinolinylidene)-ethylidene-2-thiazolinylidene]-methyl-3-ethylbenzoxasodium bromide.

The dyes are typically coated onto the substrate or microcapsules by dispersing the dye in a colorless carrier or binder and subsequently coating the dispersion onto the substrate or micrcocapsules. Suitable binders or carriers selected are those readily used in the art. Examples of such binders or carriers include gelatin, polyvinyl alcohol, polyacrylamide and acrylic latices. In one embodiment wherein the dye is associated with the microcapsules and coated as one layer, the dye is dispersed in a binder, the microcapsules are added to the dispersion, and the resultant dispersion is coated onto the substrate.

The amount and type of dye added as a color correctant is determined with reference to a test image. For example, in a three color cyan, magenta, and yellow imaging system, if the test image indicates that the cyan color-forming agent had a faster film speed than the magenta, or yellow color-forming agents, the corrective dye is selected to "slow down" the cyan color-forming microcapsules. This is accomplished, for example, by adding a corrective cyan dye to the substrate. The corrective dye is preferably located between the source of actinic radiation and the photosensitive microcapsules. The corrective cyan dye acts as a filter by absorbing some of the radiation exposure before the radiation waves have had an opportunity to contact the microcapsules. The radiation selected typically includes waves occurring in either the infrared, visible or ultraviolet spectras. Accordingly, as lesser amounts of light act upon the cyan color-forming microcapsules, the film speed of these microcapsules is effectively slowed to correspond to the film speeds of the magenta color-forming microcapsules and the yellow color-forming microcapsules.

Similarly, if two sets of microcapsules have film speeds that are faster than the third set, two corrective dyes which act as filters for the faster sets of microcapsules or a mixture of the two corrective dyes may be associated with the substrate.

The color corrective dye may be associated with the imaging sheet in a number of different configurations; the principal consideration being that the dye is able to absorb some radiation before incident or reflected radiation acts upon the microcapsules. For example, in a first configuration, the corrective dye (or dyes) is directly coated onto the front surface of the imaging substrate, and the color-forming microcapsules are coated onto the corrective dye layer. In this configuration, the substrate is preferably transparent, and the sheet is exposed to actinic radiation through its back surface. Exposure through the back surface of the substrate causes the radiation waves to pass through the substrate and through the corrective dye layer before contacting the photosensitive microcapsules. Accordingly, the dye layer absorbs some of the radiation and thereby slows the film speed of the microcapsules for which the corrective dye was intended as a filter.

In another configuration, the microcapsules are initially coated onto the substrate and the color corrective dye or dyes is then coated onto the microcapsules. In this configuration, the substrate may be either opaque or transparent and the radiation waves from the radiation source are directed toward and through the front of the sheet. By directing light toward the front of the substrate, the radiation waves first pass through the corrective dye layer which acts to selectively absorb radiation, then through the photosensitive microcapsules and then through the substrate.

In another alternative configuration, the microcapsules and corrective dye are admixed and the admixture is coated as a single layer onto the front surface of the substrate. The admixture typically is contained in a coating solvent such as polyvinyl alcohol and the solvent, having contained therein the microcapsules and corrective dye, is coated onto the substrate. Alternatively, it is envisioned that the dye can be dispersed in the external phase of an emulsion used during the formation of at least one set of microcapsules and the entire emulsion, including dispersed corrective dye, be coated onto the substrate. In this configuration, the substrate may either be opaque or transparent. If the substrate is opaque, the radiation waves are directed towards and through the front of the sheet. This enables a portion of the radiation waves to be absorbed by the corrective dye to slow the speed of the microcapsules the dye is associated with. If the substrate is transparent, the radiation waves may be directed from either the front or back surface of the substrate. Directing the radiation waves from either direction enables a portion of the waves to be absorbed by the corrective dye to slow the speed of the microcapsules the dye is associated with.

In another configuration, the substrate is transparent, the microcapsules are coated onto the front surface of the substrate and the color corrective dye(s) are coated onto the back surface of the substrate. In this configuration, the radiation waves are directed toward and through the back surface of the substrate. This enables a portion of the waves to be absorbed by the corrective dye before the waves pass through the transparent substrate and through the photosensitive microcapsules at the front surface of the substrate.

In yet another configuration, the corrective dye is incorporated into the substrate itself. This is accomplished by mixing the corrective dye(s) with the composition of the substrate, typically polyethylene terephthalate prior to forming the substrate into a sheet. In this configuration, the microcapsules are coated onto the front surface of the substrate and the radiation waves are directed toward and through the back surface of the substrate. This causes the substrate containing the corrective dye to absorb a portion of the waves before the waves pass through the photosensitive microcapsules.

In another configuration, the color corrective dye(s) may be associated with the imaging sheet with a metallized coating. For example, it is known in the art to utilize a transparent substrate having a metallized coating. An example of such a substrate is polyethylene terephthalate having coated thereon a metallic layer of aluminum. In accordance with the present invention, color corrective dye(s) can be co-evaporated with the coating metal to produce a colored substrate. As the coating is a metal layer, the substrate would have reflective properties. By incorporating a corrective dye(s), typically in the form of elements, onto or into the metal layer, light reflected from the substrate to the microcapsules would have altered spectral characteristics.

The metallized layer may be coated on either the front or back surface of the substrate. In the present invention the corrective dye is preferably located between the photosensitive microcapsules and the reflective layer. For example, if the substrate has a metallic layer coated on its front surface and a layer of microcapsules coated onto the metallic layer, the corrective dye should be interposed between the two layers. In this configuration, radiation waves are directed toward the front of the substrate and initially contact the microcapsules. Then the waves pass through the corrective layer which acts to absorb some of the waves, and the non-absorbed waves contact the metallic layer which reflects the waves toward the microcapsules. The waves pass through the corrective dye which acts to absorb an additional portion of the reflected waves and thereby selectively limit the amount and frequency of light reflected back to the microcapsules.

If the metallic layer is coated on the back surface of the transparent substrate, the corrective dye layer may either be coated directly onto the metallic layer or onto the front surface of the substrate. If the corrective dye is coated onto the front surface of the substrate, the microcapsule layer is coated onto or below the corrective dye layer. When radiation waves are directed toward the front surface of the substrate and the microcapsules are coated onto the corrective dye layer, the corrective dye acts to absorb a portion of the waves reflected from the metallic layer. If the microcapsules are located below the corrective dye layer, and the radiation waves are directed toward the front surface, the dye layer absorbs some of the waves before contacting the microcapsules. After passing through the microcapsules, the waves strike the metallic layer, are reflected and contact the microcapsules a second time. If additional filtration is necessary, a second corrective layer may be interposed between the microcapsule layer and the metallic layer to filter the reflected waves incident on the microcapsules.

In another embodiment, the color corrective dye may be integrally formed with the metallic layer. In this configuration, the metallic layer may be located on the front surface of the substrate or may be located on the back surface of the substrate in the case of a transparent substrate. The microcapsules are coated onto the front surface of the substrate such that the metallic layer (containing the corrective dye) lies below the microcapsules on either the front or back surface of the substrate. The radiation waves are directed toward the front surface of the substrate, contact and pass through the microcapsules and strike the metallic layer. The metallic layer absorbs a portion of the waves as a result of the integral containing of the corrective dye. The non-absorbed waves are then reflected and contact the microcapsules.

If a blue metallized layer is desired, cobalt particles may be co-evaporated with aluminum on the substrate. Alternatively, copper could be evaporated with aluminum or nickel to produce a reddish substrate and gold could be evaporated with nickel or aluminum to produce a yellowish substrate. By selectively combining respective amounts of cobalt, copper and gold, the colored substrate could take on any desired hue.

Alternatively, the colored metal particles could be co-dispersed with other metallic particles such as aluminum or nickel in a transparent binder, and the binder could be coated onto either the front or back surface of the substrate. Radiation waves are directed toward the front surface of the substrate, contact the microcapsules which are located on the front surface of the substrate and then contact the layer containing the metallic particles and the corrective colored particles which act to absorb some of the radiation waves. The waves are then reflected and the non-absorbed act on the microcapsules in a second pass. In this embodiment, a binder such as polyvinyl alcohol is preferred as it is colorless and does not interfere with the color altering properties of the metal layer.

After the imaging sheet has been exposed to actinic radiation, the microcapsules are ruptured in the presence of a developer sheet to form a color balanced image. If colorless color-formers are contained in the microcapsules, the color-formers react with a developer material which is located on the developer sheet as is known in the art. Typical developer materials include clay minerals such as acid clay, active clay, attapulgite, etc. organic acids such as tannic acid, gallic acid, propyl gallate, etc.; acid polymers such as phenol-formaldehyde resins, phenol acetylene condensation resins, condensates between an organic carboxylic acid having at least one hydroxy group and formaldehyde, etc.; metal salts or aromatic carboxylic acids such as zinc salicylate, tin salicylate, zinc 2-hydroxy naphthoate, zinc 3,5 di-tert butyl salicylate, oil soluble metal salts of phenol-formaldehyde novolak resins, zinc carbonate etc. and mixtures thereof.

Having described the invention in detail and by reference to preferred embodiments thereof, it will be apparent that modifications and variations are possible without departing from the scope of the invention defined in the appended claims.

What is claimed is:

1. An imaging sheet used for achieving color balance in a full color imaging system, said sheet comprising:
    a substrate having front and back surfaces;
    a layer of photosensitive microcapsules on the front or back surface of said substrate, said microcapsules including a first, a second and a third set of microcapsules, each set of microcapsules containing a different image-forming agent and a photohardenable or photosoftenable composition; and
    one or more color corrective dyes having a maximum absorptivity in the visible spectrum to provide color balance.

2. The imaging sheet according to claim 1 wherein said microcapsules contain a photohardenable composition.

3. The imaging according to claim 2 wherein said first, second and third sets of microcapsules respectively contain cyan, magenta and yellow color-forming agents.

4. The imaging sheet according to claim 3 wherein said substrate is transparent.

5. The imaging sheet according to claim 4 wherein said one or more corrective dyes is coated onto said front surface of said substrate and wherein said layer of microcapsules is coated onto said one or more corrective dyes.

6. The imaging sheet according to claim 4 wherein said layer of microcapsules is coated onto the front surface of said substrate and wherein said one or more corrective dyes is coated onto the back surface of said substrate.

7. The imaging sheet according to claim 4 wherein said one or more corrective dyes is incorporated with said substrate.

8. The imaging sheet according to claim 4 wherein said substrate is a substrate having a metallized layer located on either the front surface or the back surface of the substrate.

9. The imaging sheet according to claim 8 wherein said metallized layer is located on the front surface of said substrate, said one or more corrective dyes is located on said metallized layer and said layer of microcapsules is located on said one more corrective dyes.

10. The imaging sheet according to claim 8 wherein said metallized layer is located on the front surface of said substrate, said layer of microcapsules is located on said metallized layer and said one or more corrective dyes is located on said layer of microcapsules.

11. The imaging sheet according to claim 8 wherein said metallized layer is located on the back surface of said substrate, said one or more corrective dyes is located on said metallized layer and said layer of microcapsules is located on said front surface of said substrate.

12. The imaging sheet according to claim 8 wherein said metallized layer is located on the back surface of said substrate, said one or more corrective dyes is located on the front surface of said substrate and said layer of microcapsules is located on said one or more corrective dyes.

13. The imaging sheet according to claim 8 wherein said metallized layer and said one or more corrective dyes are co-evaporated on the front or back surface of said substrate and wherein said layer of microcapsules is coated onto said front surface of said substrate.

14. The imaging sheet according to claim 13 wherein said metallized layer comprises a layer containing aluminum or nickel particles.

15. The imaging sheet according to claim 14 wherein metallized layer further comprises cobalt particles, copper particles, gold particles and mixtures thereof.

16. The imaging sheet according to claim 8 wherein said metallic layer comprises a transparent binder containing particles of fine metal and said one or more corrective dye is located on either the front or back surface of said substrate and wherein said layer of microcapsules is coated onto the front surface of said substrate.

17. The imaging sheet according to claim 16 wherein said binder comprises polyvinyl alcohol.

18. The imaging sheet according to claim 3 wherein said layer of microcapsules is coated onto said front surface of said substrate and wherein said one or more corrective dyes is coated as a layer onto said layer of microcapsules.

19. The imaging sheet according to claim 3 wherein said one or more corrective dyes is admixed with said layer of microcapsules to form an admixture and wherein said admixture is coated onto the front surface of said substrate.

20. The imaging sheet according to claim 1 wherein said image-forming agents are colorless color-forming agents capable of forming an image when in contact with a developer material.

21. The imaging sheet according to claim 20 wherein said developer material is associated with said image-forming agents on a sheet separate from said imaging sheet.

22. The imaging sheet according to claim 1 wherein said one or more corrective dyes are selected from the group consisting of: anhydro-3,3-dicarboxyethyl-5,5,9-trimethyl-2,2-thiacarbocyanine betaine, anhydro-3,3-dicarboxymethyl-2,2-thiacarbocyanine betaine, 3,3-diallyl-2,2-thiacarbocyanine bromide, 3,3-diallyl-2,2-thiacarbocyanine iodide, 6,7,6,7-dibenzo-3,3-diethyl-9-methyl-2,2-thiacarbocyanine iodide, 3,3-di-n-butyl-9-methyl-2,2-thiacarbocyanine iodide, 2-(p-diethylaminostyryl)-1-ethylpyridine iodide, 3,3-diethyl-9-methyl-2,2-selenacarbocyanine iodide, 3,3-diethyl-9,11-neopentylene-2,2-thiadicarbocyanine iodide, 1,1-diethyl-2,4-quinocarbocyanine iodide, 3,3-diethyl-2,2-thiazolinocarbocyanine iodide, 2-(p-dimethylaminostyryl)-1-methylpyridine iodide, 3,3,9-triethyl-2,2-thiacarbocyanine, 2-[3-ethyl-4-oxo-5-(1-ethyl-4-quinolinylidene)-ethylide-2-thiazolinylidene]-methyl-3-ethylbenzoxasodium bromide.

* * * * *